United States Patent
Sarhan et al.

(10) Patent No.: US 9,922,151 B2
(45) Date of Patent: Mar. 20, 2018

(54) 3D CIRCUIT DESIGN METHOD

(71) Applicant: Commissariat à l'Énergie Atomique et aux Énergies Alternatives, Paris (FR)

(72) Inventors: Hossam Sarhan, Grenoble (FR); Olivier Billoint, Grenoble (FR); Fabien Clermidy, Saint-Egreve (FR); Sébastien Thuries, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 54 days.

(21) Appl. No.: 14/941,331

(22) Filed: Nov. 13, 2015

(65) Prior Publication Data

US 2016/0140276 A1 May 19, 2016

(30) Foreign Application Priority Data

Nov. 13, 2014 (FR) .................... 14 60962

(51) Int. Cl.
*G06F 17/50* (2006.01)

(52) U.S. Cl.
CPC ...... *G06F 17/5045* (2013.01); *G06F 17/5068* (2013.01); *G06F 17/5077* (2013.01); *G06F 17/5081* (2013.01)

(58) Field of Classification Search
CPC .............. G06F 17/5045; G06F 17/5068; G06F 17/5077; G06F 17/5081
USPC ....... 716/103, 122, 123, 124, 125, 130, 131; 703/2, 16
See application file for complete search history.

(56) References Cited

U.S. PATENT DOCUMENTS 7,801,325 B1 * 9/2010 Hetzel ................ G06F 17/5077
382/100
2011/0092030 A1 4/2011 Or-Bach et al.

OTHER PUBLICATIONS

French Search Report dated Jun. 1, 2015 from corresponding French Application No. 14/60962.
Liu, Q. et al., RALP:*Reconvergence-aware* layer partitioning for 3D FPGAs 11, 2013 International Conference on Reconfigurable Computing and FPGAS (Reconfig), IEEE, Dec. 9, 2013 (Dec. 9, 2013), pp. 1-6, XP032562635.

(Continued)

*Primary Examiner* — Phallaka Kik
(74) *Attorney, Agent, or Firm* — Wolf, Greenfield & Sacks, P.C.

(57) ABSTRACT

The invention concerns a 3D circuit design method implemented by a processing device involving partitioning a 2D circuit representation into two or more tiers, the 2D circuit representation defining circuit elements interconnected by interconnecting wire each weighted based on at least one of: its length; its propagation delay; and its priority level, the 2D circuit representation initially forming a first tier, the partitioning involving: a) selecting a first highest ranking wire, interconnecting at least first and second circuit elements in the first tier; b) moving one of the first and second circuit elements connected by the selected wire to a further tier of the 3D circuit representation and replacing the interconnecting wire with a connecting via between the first and further tiers; and c) repeating a) and b) for one or more further interconnecting wires of the first tier.

13 Claims, 2 Drawing Sheets

(56) References Cited

OTHER PUBLICATIONS

Karypis, G., et al. Multilevel Hypergraph Partitioning: Applications in VLSI Domain 11, IEEE Transactions on Very Large Scale Integration (VLSI) Systems, IEEE Service Center, Piscataway, NJ, USA, vol. 7, No. 1, 1 mars 1999 (Mar. 1, 1999), XPO 11063405.
Balachandran Set Al: "A Priori 1-15 Wirelength and Interconnect Estimation Based on Circuit Characteristics", IEEE Transactions on Computer Aided Design of Integrated Circuits and Systems, IEEE Service Center, Piscataway, NJ, US, vol. 24, No. 7, 1 juillet2005 (Jul. 1, 2005), pp. 1054-1065, XPO1 1135384.
Tada J., et al., A Middle-Grain Circuit Partitioning Strategy for 3-D Integrated Floating-Point Multipliers, Graduate School of Science and Engineering, Yamagata University, Yonezawa, 992-8510, Japan, pp. 2-6.
Hu, C.H., et al., A Multilevel Multilayer Partitioning Algorithm for Three Dimensional Integrated Circuits, Chung Yuan Christian University, Chung Li, Taiwan, 2010 IEEE, 11th Int'! Symposium on Quality Electronic Design, pp. 483-487.
Ega Wa, R. et al, Evaluation of Fine Grain 3-D Integrated Arithmetic Units, 2009 IEEE, Research Division on Supercomputing Systems, Cyberscience Center, Tohoku University Sendai, 980-0866, Japan and, Graduate School of Science and Engineering, Yamagata University, Yonezawa, 992-8510, Japan, pp. 978-985.
Kumar, A. et al., TSV and DFT Cost Aware Circuit Partitioning for 3D-S0Cs, Symposium on Quality Electronic Design, 978-1-4673-1036-9/12/$31.00 ©2012 IEEE, pp. 21-26.
Putt ASW Amy, Ket al., The Impact of 3-Dimensional Integration on the Design of Arithmetic Units, 0/7803-9390-2/06/$20.00© 2006 IEEE, pp. 4951-4954.
Nakamura, M. et al., 1.25-Gb/s Burst-Mode Receiver I Cs With Quick Response for PON Systems, IEEE Journal of Solid-State Circuits, vol. 40, No. 12, Dec. 2005, pp. 2680-2688.
Ma, Yet al., Investigating the Effects of Fine-Grain Three-Dimensional Integration on Microarchitecture Design, ACM Journal on Emerging Technologies in Computing Systems, vol. 4, No. 4, Article 17, Pub. date: Oct. 2008, pp. 17-17.30.
Ghosal, P., Partitioning in 3D ICs: A TSV Aware Strategy with Area Balancing; Dept. of Information Technology, Bengal Engineering and Science University, Shibpur, Howrah India; 5 pages.
Batude, P., et al. Demonstration of low temperature 3D sequential FDSOJ integration down to 50 nm gate length, 2011 Symposium on VLSI Technology digest of Technical Papers, pp. 158-159.
Thorolfsson, T., et al. A 10.35 mW/GFlop Stacked SAR DSP Unit using Fine-Grain Partitioned 3D Integration, 978-1-4673-1556-2/12/$31.00@}2012 IEEE, 4 pages.
Sawicki, S., A Cells and I/O Pins Partitioning Refinement Algorithm for 3D VLSI Circuits, 978-1-4244-5091-6/09/$25.00 ©2009 IEEE, pp. 852-855.

* cited by examiner

3D CIRCUIT DESIGN METHOD

CROSS REFERENCE TO RELATED APPLICATIONS

This application claims the priority benefit of French Patent Application Number 14/60962, filed on Nov. 13, 2014, which application is hereby incorporated by reference to the maximum extent allowable by law.

TECHNICAL FIELD

The present disclosure relates to the field of integrated circuit design, and in particular to the design of 3-dimensional circuits.

DISCUSSION OF THE RELATED ART

In order to provide improved compactness and performance, it has been proposed to implement integrated circuits using so-called 3D technology, in which two or more tiers are arranged in a stack, each tier comprising a semiconductor layer forming a 2D circuit, and the tiers being interconnected by connecting vias.

Examples of 3D technologies include 3D High-Density Through-Silicon-Via (HD-TSV) technology, copper-to-copper technology, and monolithic 3D (M3D) integration technologies.

The design of 3D circuits generally starts from a 2D circuit representation of the whole circuit, and involves a partitioning operation in which the various portions of the 2D circuit representation are assigned to the tiers of the 3D circuit.

Current partitioning methods that have been proposed use cost functions to either minimize the number of 3D vias in the 3D circuit representation, or to achieve a desired surface area distribution between the tiers. For example, the publication by J. Tada et al., entitled "A Middle-Grain Circuit Partitioning Strategy for 3-D Integrated Floating-Point Multipliers", 3DIC, pages 1-6, IEEE 2011, describes one such partitioning method that equalizes the area of each layer and avoids the critical path crossing different layers as much as possible.

However, partitioning is a complex task, and the 3D circuit designs realized based on existing partitioning methods tend to result in 3D circuits that are far from optimal in terms of performance and/or power consumption. There is thus a need in the art for a new method and device for partitioning a 2D circuit representation to generate a 3D circuit representation of a 3D circuit having relatively good performance and/or power consumption.

SUMMARY

It is an aim of embodiments of the present description to at least partially address one or more problems in the prior art.

According to one aspect, there is provided a 3D circuit design method implemented by a processing device, the method comprising: partitioning a 2D circuit representation into two or more tiers of a 3D circuit representation, wherein the 2D circuit representation defines a plurality of circuit elements and a plurality of interconnecting wires, each interconnecting wire representing an electrical connection between two or more circuit elements, wherein each interconnecting wire is weighted based on at least one of: its length; its propagation delay; and its priority level based on the extent to which it represents a critical transmission path, the 2D circuit representation initially forming a first tier of the 3D circuit representation, the partitioning comprising:

a) selecting a first wire, interconnecting at least first and second circuit elements in the first tier, the first wire for example being selected as the highest ranking wire among the interconnecting wires based on its weight;

b) moving one of the first and second circuit elements connected by the selected wire to a further tier of the 3D circuit representation and replacing the interconnecting wire with a connecting via between the first and further tiers; and c) repeating a) and b) for one or more further interconnecting wires of the first tier.

According to one embodiment, the first wire has a weight greater than a first threshold.

According to one embodiment, a) and b) are repeated until one or more of the following conditions have been met: there are no more interconnecting wires in the first tier having a weight greater than the first threshold; the connecting via count has reached or has exceeded a limit; a certain area ratio between the first tier and one or more further tier has been achieved; and a certain power ratio between the first tier and one or more further tier has been achieved.

According to one embodiment, selecting a first wire comprises ranking the interconnecting wires based on their weights, and selecting the interconnecting wire having the highest weight.

According to one embodiment, the interconnecting wires are weighted based on their lengths, and the first threshold is a length threshold.

According to one embodiment, the wire lengths are estimated using a half-perimeter-wire-length (HPWL) model.

According to one embodiment, the method further comprises:

d) identifying in the 3D circuit representation an interconnecting wire having a weight less than a second threshold and that has been replaced by a connecting via;

e) restoring the identified interconnecting wire by replacing the connecting via by an interconnecting wire between circuit elements in a same tier; and f) repeating d) and e) until there are no connecting vias replacing interconnecting wires that have a weight of less than the second threshold.

According to one embodiment, each circuit element in the 2D circuit representation comprises an indication of at least one of: its surface area; and its power consumption; the method further comprising: verifying whether one of: an area ratio limit; a power consumption ratio limit; and a connecting via count limit, has been exceeded in the 3D circuit representation, and if so restoring one or more interconnecting wires by replacing the connecting via by an interconnecting wire between circuit elements in a same tier.

According to one embodiment, the 2D circuit representation is a 2D netlist, and partitioning the 2D circuit representation comprises converting the 2D netlist into a hypergraph having vertices corresponding to the circuit elements of the 2D circuit representation, and edges corresponding to the interconnecting wires of the 2D circuit representation.

According to one embodiment, the circuit elements are standard cells selected from a standard cell library.

According to one embodiment, the circuit elements are semiconductor devices, at least one of the circuit elements being a transistor.

According to one embodiment, the method further comprises: performing place and route on the 3D circuit representation to generate a 3D circuit design.

According to one embodiment, the method further comprises fabricating an integrated circuit based on the 3D circuit design.

According to a further aspect, there is provided a non-transitory storage device storing a computer program that, when executed by a processing device, causes the above method to be implemented.

According to a further aspect, there is provided a computing device comprising: one or more memories storing instructions and a 2D circuit representation; and a processing device adapted to generate, under control of the instructions, a 3D circuit representation by: partitioning the 2D circuit representation into two or more tiers of the 3D circuit representation, wherein the 2D circuit representation defines a plurality of circuit elements and a plurality of interconnecting wires, each interconnecting wire representing an electrical connection between two or more circuit elements, wherein each interconnecting wire is weighted based on at least one of: its length; its propagation delay; and its priority level based on the extent to which it represents a critical transmission path, the 2D circuit representation initially forming a first tier of the 3D circuit representation, the partitioning comprising:

a) selecting a first wire, interconnecting at least first and second circuit elements in the first tier, the first wire for example being selected as the highest ranking wire among the interconnecting wires based on its weight;

b) moving one of the first and second circuit elements connected by the selected wire to a further tier of the 3D circuit representation and replacing the interconnecting wire with a connecting via between the first and further tiers; and c) repeating a) and b) for one or more further interconnecting wires of the first tier.

According to one embodiment, the first wire has a weight greater than a first threshold.

According to one embodiment, the first wire further interconnects one or more further circuit elements to the first and second circuit elements, and b) further comprises moving one or more of the further circuit elements to the further tier.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, certain embodiments will be described based on the design of a 3D circuit that uses monolithic 3D technology. Such a technology is described in more detail in the publication by P. Batude et al., entitled "Demonstration of low-temperature 3D sequential FDSOI integration down to 50 nm gate level", VLSI Technology (VLSIT), symposium on, IEEE, 2011, the contents of which is hereby incorporated by reference to the extent allowable by the law. Such a technology for example permits 3D vias having diameters as low as 0.1 to 0.25 µm, a pitch of as low as 0.2 to 0.5 µm, and a density as high as 25 million per mm².

However, it will be apparent to those skilled in the art that the embodiments described herein could be applied to other 3D technologies, such as: copper-to-copper technology, which is for example discussed in more detail in the publication by R. Taibi, et al., entitled "Full Characterization of Cu/Cu Direct Bonding for 3D Integration", Electronic Components and Technology Conference (ECTC), 2010 Proceedings 60th. IEEE, 2010, the contests of which is hereby incorporated by reference to the extent allowable by the law; and 3D High-Density Through-Silicon-Via (HD-TSV) technology, which is for example discussed in more detail in the publication by H. Chaabouni, et al., entitled "Investigation on TSV impact on 65 nm CMOS devices and circuits", Electron Devices Meeting (IEDM), IEEE International, 2010, the contents of which is hereby incorporated by reference to the extent allowable by the law.

Figure 1:
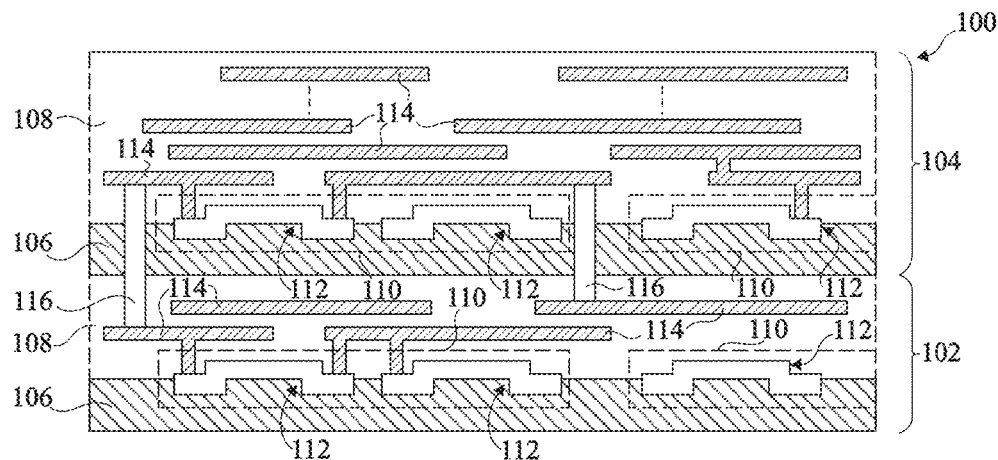
FIG. 1 is a cross-section view of a portion of a 3D circuit comprising two tiers according to an example embodiment of the present disclosure.

FIG. 1 is a cross-section view of a portion 100 of a monolithic 3D integrated circuit according to an example embodiment in which there are two tiers, a bottom tier 102 and a top tier 104. Whereas a 2D integrated circuit generally comprises a single semiconductor layer in which transistors are formed in substantially the same plane, in a 3D integrated circuit, each tier comprises a semiconductor layer 106. The semiconductor layers 106 are for example of silicon, and each tier also for example comprises a metal layer 108 connecting devices in the semiconductor layer 106.

CMOS (complementary MOS) devices 110 are distributed in the semiconductor layer 106, and for example correspond to standard cells formed of transistors 112. As known to those skilled in the art, a standard cell is a group of transistors and interconnections that enable a specific Boolean function or storage function to be realized. During circuit synthesis, a standard cell library is generally used in which each standard cell is represented by data describing its characteristics. For example, the characteristics may include the Boolean function of the standard cell, represented for example by a truth table or the like, and the physical design of the standard cell, represented for example by a netlist of the transistors and/or other devices that implement the standard cell, and/or by a layout.

The metal layers 108 comprise metal interconnections 114, for example formed of copper or of another conducting material. Some of the interconnections connect transistors within a standard cell, while others form interconnecting wires between standard cells. Furthermore, two connecting vias 116, also referred to herein as 3D vias, are represented in FIG. 1 and provide interconnections between the standard cells 110 in different tiers. As mentioned above, the 3D vias 116 for example have diameters in the range of 0.1 to 0.25 µm in the case of monolithic 3D technology. In the case of HD-TSV or Copper-to-copper technology, the 3D vias 116 for example have diameters of around 3 µm.

When compared to a 2D circuit, an advantage of a 3D circuit is that the surface area can be reduced. Furthermore, as will be described in more detail below, it is possible to improve performance by significantly reducing the wire lengths in the circuit.

Figure 2:
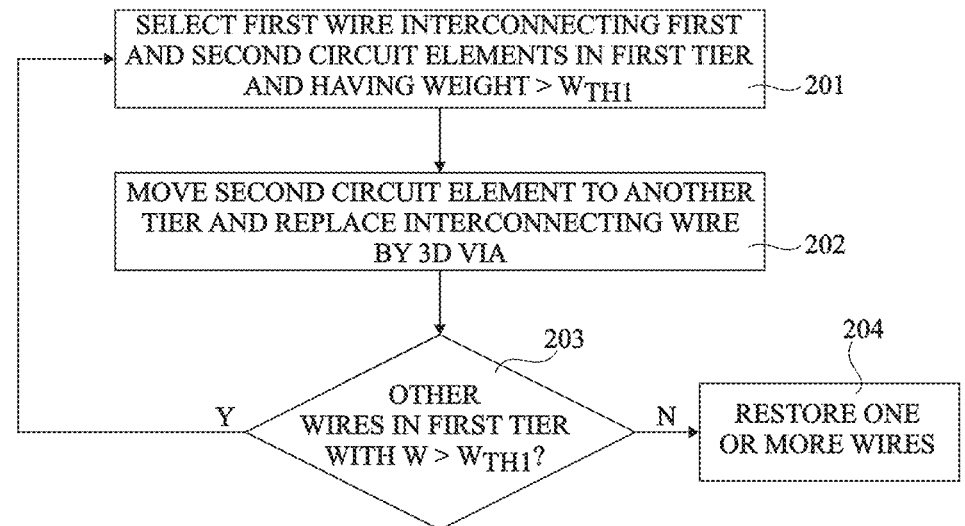
FIG. 2 is a flow diagram showing operations in a 3D circuit design method according to an example embodiment of the present disclosure.

During the design of a 3D circuit, such as the one of FIG. 2, the circuit is for example first generated as a 2D netlist defining the various standard cells that are to form the circuit in a 2D implementation. The 2D netlist is then for example partitioned to define the standard cells that are to form each tier of the 3D circuit.

FIG. 2 is a flow diagram showing operations in a method of 3D circuit design, and in particular in a method of generating a 3D circuit representation by partitioning a 2D netlist into tiers of a 3D circuit. The method is for example implemented in software, in other words by a processing device under the control of instructions in an instruction memory.

The 2D netlist has for example been converted into a hypergraph representation. As will be described in more detail below, a hypergraph representation is comprised of vertex nodes that represent circuit elements, and hyper-edges that represent interconnecting wires between the circuit elements. The term "circuit element" is used herein to designate any granularity of device in the circuit, which could correspond to single semiconductor devices, such as transistors, capacitors or resistors, or groups of semiconductor devices, such as logic gates or larger devices, for example implemented by standard cells. In the case of capacitors and resistors, they are for example defined by a synthesized netlist, in other words a netlist generated by a synthesis process based on standard cell libraries. In the case of transistors, a more detail netlist, such as a SPICE netlist, is for example used to define the transistors and allow the wiring interconnections between the transistors to be estimated.

The hypergraph representation for example permits a weighting to be applied to the vertex nodes, and also to the hyper-edges. It is assumed herein that at least the hyper-edges have been weighted. The weight is for example based on the potential performance gain that could be obtained if the wire is replaced by a 3D via, the higher the potential performance gain, the higher the weighting. The main performance characteristic of a wire is its length, as the longer the wire, the greater its RC value, and thus the greater the time delay and power consumption of the wire. Each weight is therefore for example generated based on either the length of the corresponding interconnecting wire and/or the propagation delay of the corresponding interconnecting wire. Alternatively or additionally, the wires could be weighted based on their priority level in view of the signals that they propagate, the weight for example indicating the degree to which the wire represents a critical transmission path in the 2D circuit design. Priority levels are for example assigned to the critical paths in the design, such as for example, the clock signal, the reset signal and/or the control signals of the design. These signals are specific to each design.

The weight assigned to each hyper-edge, in other words to each interconnecting wire, is for example proportional to the wire length, propagation delay or priority level of the wire. This means that the higher the wire length, propagation delay or priority level, the higher the weight. However, in alternative embodiments, another convention could be used when weighting the interconnecting wires. For example, the weights could be inversely proportional to the wire length, propagation delay or priority level, such that they have the opposite significance. In other words, the higher the wire length, propagation delay or priority level, the lower the weight.

It will be apparent to those skilled in the art that, rather than a hypergraph representation, other representations of the 2D circuit that permit a weighting to be applied to the connecting wires could be used.

It is assumed that the number of tiers in the 3D circuit representation has been chosen by a user or otherwise determined. Furthermore, although some circuit elements may be fixed to particular tiers before partitioning, it is assumed that all unplaced circuit elements of the 2D netlist are initially assigned to a first tier of the 3D circuit representation.

In a first operation 201, a first wire of the 2D netlist, interconnecting at least first and second circuit elements in the first tier, and that has a weight greater than a first threshold $W_{TH1}$, is selected. In some embodiments, the wire may further interconnect the first and second circuit elements to one or more further circuit elements. This selection is for example made by ranking the interconnecting wires in order based on their weights, and initially selecting the highest ranking interconnecting wire, which is the wire having the highest or lowest weight, depending on the particular weighting convention that is applied. Indeed, the highest ranking interconnecting wire is for example the wire having the longest wire length or propagation delay, or the highest priority. Of course, selecting the highest ranking interconnecting wire does not necessary involve ranking all interconnecting wires. For example, the highest ranking interconnecting wire could be selected by comparing the weights of two interconnecting wires, and retaining the wire having the highest or lowest weight for comparison with another wire, and repeating this operation until all of the interconnecting wires have been compared.

As will be described in more detail below, the threshold $W_{TH1}$ is for example chosen based on the performance of a 3D via in the given technology with respect to an interconnecting wire having a given weight.

In a second operation 202, one of the first and second circuit elements is moved to a further tier of the 3D circuit design, and the selected interconnecting wire is replaced by a 3D via. The choice between moving the first or second circuit element to the further tier is for example based on the weighting of the other interconnecting wires of each circuit element, and/or on other physical characteristics of the first and second circuit elements, such as their surface area or power consumption. Furthermore, in the case that the selected interconnecting wire interconnects more than two circuit elements, more than one of the circuit elements may be moved to the further tier. In one embodiment, up to half the number of circuit elements interconnected by the selected wire are moved to the further tier.

The selected interconnecting wire is cut, in other words it is designated as being replaced by a 3D via between the first tier and the further tier. Furthermore, any other interconnecting wires connecting the moved circuit element to other circuit elements in the first tier will also be cut, and replaced by 3D vias.

In a third operation 203, it is determined whether there are other interconnecting wires in the first tier having a weight greater than the threshold $W_{TH1}$. If so, operations 201 and 202 are repeated for a new interconnecting wire in the first tier. The new interconnecting wire is for example the highest ranking interconnecting wire once the previous cuts have been taken into account. The operations 201 and 202 are for example repeated until there are no longer any wires in the first tier having a weighting greater than the threshold $W_{TH1}$. When this is the case, the next operation after operation 203 will be operation 204. Alternatively or additionally, in some embodiments operation 203 may also contain a verification of one or more further criteria, such as a limit in the area ratio or power ratio between the tiers, or a limit in the number of 3D vias, and the method may go to operation 204 if one or more of these further criteria is met.

In operation 204, the method may end. Alternatively, one or more of the cut interconnecting wires may be restored if its weighting was lower than a further threshold $W_{TH2}$, the cutting of which for example leads to a significant performance degradation. Alternatively or additionally, one or more cut interconnecting wires may be restored if the overall number of permitted 3D vias or the 3D via density limit has been exceeded, or if a target area or power distribution between the tiers has not been achieved.

Figures 3A, 3B, 3C:
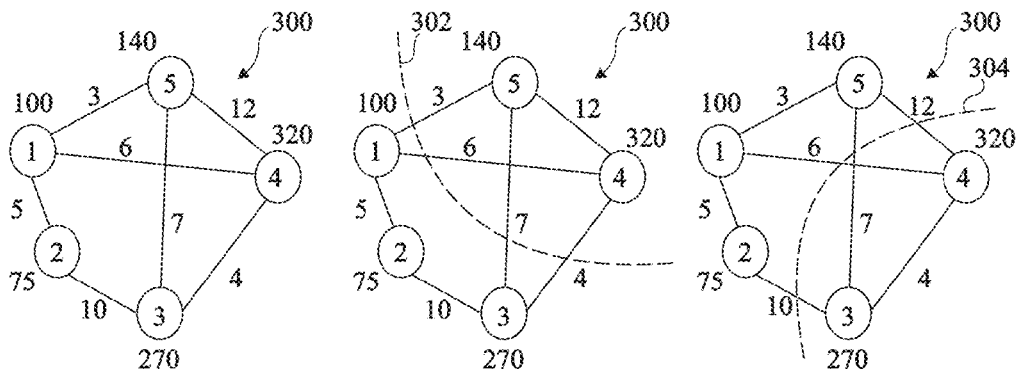
FIGS. 3A to 3C are hypergraph representations of a circuit according to an example embodiment of the present disclosure.

FIG. 3A illustrates an example of hypergraph 300 in which there are five vertex nodes representing circuit elements labelled 1 to 5. These vertex nodes are for example assigned weights of 100, 75, 270, 320 and 140 respectively, which in this example represent their respective surface areas. Furthermore, hyper-edges are shown linking the vertex nodes, and representing interconnections between the circuit elements. The hyper-edges are weighted, the weights ranging from 3 to 12 in this example, which for example presents the length of the corresponding wire.

FIG. 3B illustrates the same hypergraph 300 as FIG. 3A, and also illustrates, by a dashed line 302, a possible partitioning of the circuit elements into two tiers if the main criterion is an equalization of the surface area in each of the tiers. Indeed, the circuit elements 1, 2 and 3 are grouped together, leading to a total surface area weight of 445, which is close to the total surface area weight of 460 of the remaining circuit elements 4 and 5. However, wires having weights of 3 and 4 are cut according to this partitioning strategy, and those having weights of 10 and 12 have not been cut, implying relatively poor performance of the 3D circuit resulting from this design in terms of delay and power consumption.

FIG. 3C also illustrates the same hypergraph 300 as FIG. 3A, and illustrates, by a dashed line 304, a partitioning of the circuit elements into two tiers according to the partitioning method described herein based on the weights of the interconnecting wires. Thus the wires weighted 10 and 12 are cut, along with wires weighted 6 and 7, and the wires weighted 3, 4 and 5 remain intact, implying an improved performance of the 3D circuit resulting from this design in terms of delay and power consumption when compared to the case of FIG. 3B.

Figure 4:
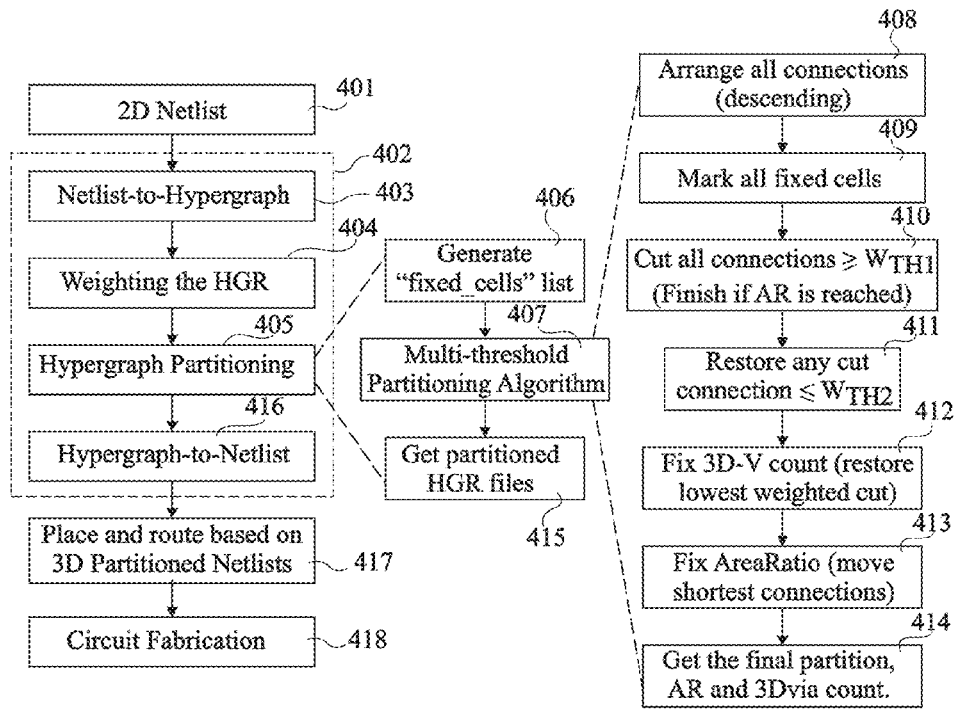
FIG. 4 is a flow diagram showing operations in a 3D circuit design method in more detail according to an example embodiment of the present disclosure.

FIG. 4 is a flow diagram illustrating operations in a method of 3D circuit design according to an example embodiment.

In a first operation 401, the 2D netlist is generated, for example by a circuit designer using a library of standard cells.

In a subsequent operation 402, the 2D netlist is partitioned. This for example involves sub-operations 403 to 416, as will now be described.

In operation 403, the 2D netlist is converted into a hypergraph representation, or other suitable representation.

In a subsequent operation 404, the hypergraph is weighted with weights to be used during the partitioning algorithm. For example, at least each hyper-edge of the hypergraph is weighted with a numerical value representing its weight. As described above, the weights are for example based on the physical characteristics of the corresponding wires. In the case that each wire is weighted based on wire length, the wire lengths may be determined by performing a place and route operation on the 2D netlist. Alternatively, a half-perimeter-wire-length (HPWL) model could be used to estimate the wire lengths, according to which the wire length of each interconnect is for example calculated based on the summation of the width and height of the standard cells that it connects. The width and height of the standard cells are for example defined in the standard cell library.

Additionally, each vertex may be weighted based on physical characteristics of the corresponding circuit element, such as its physical cell area, its leakage, or its internal power consumption.

In a subsequent operation 405, hypergraph partitioning is performed. This operations involves sub-operations 406 to 415.

In the operation 406, a "fixed_cells" list is for example generated, listing the cells that should be placed in certain tiers of the 3D circuit, and an indication of the tier in which it is to be placed. This list is for example user-defined, and may be generated automatically based on a user specification file. For example, all the design ports could be located in one of the tiers, and thus it could be desired that all circuit elements connected to design ports are located in this tier. Additionally or alternatively, the circuit design may comprise a synchronous clock tree in one of the tiers, and thus all of the clocked standard cells may be fixed to this tier, and form part of the fixed cell list.

In a subsequent operation 407, the multi-threshold partitioning algorithm described above and based on weight thresholds $W_{TH1}$ and $W_{TH2}$ is implemented. This operation involves sub-operations 408 to 414.

In operation 408, the interconnecting wires are for example ranked in descending order based on their respective weights. For example, interconnecting wires are arranged from the longest to the shortest.

In a subsequent operation 409, the fixed cells indicated by the list generated in operation 406 are for example marked. For example, the cells in the "fixed_cells" list generated in operation 406 are identified such that these cells will not be transferred from one tier to another during subsequent partitioning operations.

In a subsequent operation 410, the interconnecting wires having weights greater than the threshold $W_{TH1}$ are cut, and replaced by vias, as described above. This operation is for example iterative, the list of connections being re-evaluated after each cut, and for example may stop when there are no longer any wires with weights greater than $W_{TH1}$, or when another criterion, such as an area ratio AR, has been met.

In a subsequent operation 411, any cuts of interconnecting wires having a weight less than the threshold $W_{TH2}$ are for example restored. The threshold $W_{TH2}$ is different, for example lower, than the threshold $W_{TH1}$. For example, a weight value $W_V$ can be defined that corresponds to an interconnecting wire having equivalent performance to a 3D via. The threshold $W_{TH1}$ is for example chosen to be greater than $W_V$, and the threshold $W_{TH2}$ is for example chosen to be equal to or lower than $W_V$.

In a subsequent operation 412, the 3D-via count is optionally fixed, if a limit in the number or density of 3D-vias was exceeded. This is for example achieved by restoring one or more of the interconnecting wires, starting with the ones having the lowest weight. For example, the wires are ranked in order from the lowest weight to the highest weight, and wires are restored starting from lowest weight until the 3D-via number or density limit is no longer exceeded.

In a subsequent operation 413, the area ratio between tiers in the 3D design is optionally fixed, if a desired area ratio has not been met. For example, it may be desired that the area ratio in the case of a two-tier design falls within the limits a and b, where a is for example 40/60, and b is 60/40, in other words one tier does not have less than 40 percent or more than 60 percent of the total surface area. If the desired area ratio has not been met, one or more of the interconnecting wires can be restored, again for example starting with the ones having the lowest weight. Alternatively, in order to reduce the number of interconnecting wires that are restored, those wires associated with the circuit elements having the highest surface area could be restored first.

While not shown in FIG. 4, rather than or in addition to fixing an area ratio between the tiers, and power ratio can also be fixed in a similar manner, assuming that the power consumed by each circuit element is known.

In a subsequent operation 414, the final tier partition of the 3D circuit design is for example generated, along with its area ratio or ratios between the tiers, and the 3D-via count.

After the multi-threshold partitioning algorithm 407, the subsequent operation is 415, in which the partitioned hypergraph files are generated, thereby completing the multi-threshold partitioning method.

After the hypergraph partitioning operation 405, the subsequent operation is 416, in which the hypergraph is for example converted back to a netlist, the netlist being a 3D partitioned netlist defining the 2D circuit associated with each tier of the 3D design. The 3D netlist for example makes a distinction between interconnecting wires within a same tier, and the 3D vias between tiers. For example, the 3D netlist comprises a 2D netlist for each tier, and a hierarchical top-level netlist defining the connections between the 2D netlists, each of these connections represent a 3D via.

After partitioning of the 2D netlist to generate the 3D partitioned netlist by the operations 402, a subsequent operation 417 for example involves performing place and route based on the 3D partitioned netlist. Place and route for example involves a first stage of deciding where to place each circuit element within its respective tier, and a second stage of designing the interconnecting wires and 3D vias for interconnecting the circuit elements. For example, as mentioned above, the 3D netlist may comprise a 2D netlist for each tier, and a hierarchical top-level netlist, and this step involves performing place and route on each 2D netlist, wherein the interconnections between the 2D netlists indicated by the top-level netlist are implemented as vias.

In a subsequent operation 418, one or more 3D circuits are for example fabricated based on the 3D circuit design generated by the place and route operation 417.

Figure 5:
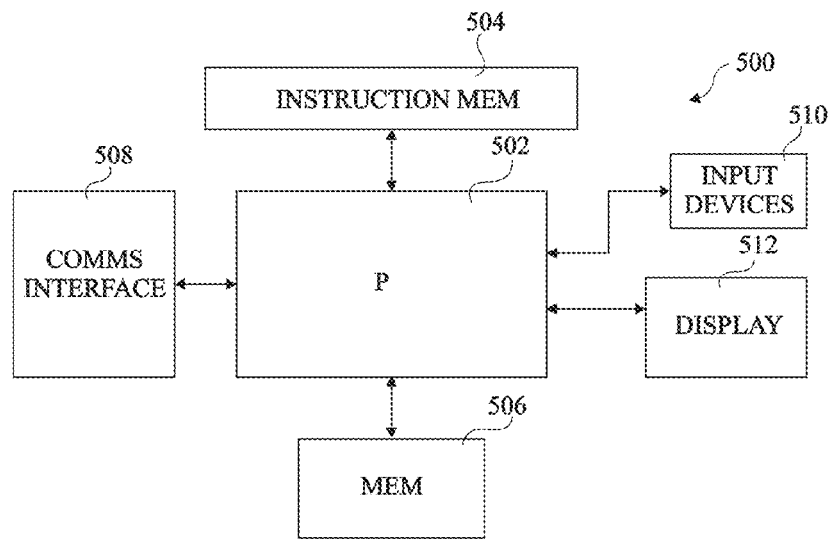
FIG. 5 illustrates a computing device for generating a 3D circuit representation according to an example embodiment of the present disclosure.

FIG. 5 schematically illustrates a computing device 500 for implementing the partitioning method of FIG. 2 and/or of operation 402 of FIG. 4 as described above.

The computing device 500 for example comprises a processing device 502, which may comprise one or more processors under the control of instructions stored by an instruction memory 504. A memory 506, which may be integral with memory 504, or a distinct memory device, is also coupled to the processing device 502, and for example stores the 2D netlist prior to partitioning, and the 3D partitioned netlist after implementation of the partitioning method by the processing device 502.

A communications interface 508 is also for example provided for coupling the processing device 502 to one or more networks, and for example permitting the 3D circuit design to be transmitted to a manufacturing plant for fabrication.

One or more input devices 510 and a display 512 may also provide a user interface allowing a user to enter certain parameters during the partitioning method, for example to define the number of tiers of the 3D circuit design, and/or to indicate the circuit elements that are to be fixed to a given tier.

An advantage of the 3D partitioning methods described herein based on weighted interconnecting wires is that they lead to 3D circuits having improved performance with respect circuits generated using other partitioning methods. For example, the publication by the present inventors entitled "An Unbalanced Area Ratio Study for High Performance Monolithic 3D Integrated Circuits", IEEE Computer Society Annual Symposium on VLSI (ISVLSI), 8-10 Jul. 2015, pages 350-355, the contents of which is hereby incorporated by reference to the extent permitted by the law, presents in table 2 a comparison of a physical aware partitioning (PAP) methodology, based on the principles described herein, with other methodologies such as the hMetis methodology, and demonstrates an improvement in the total wire length (TWL) in the majority of cases. Furthermore, the 3D partitioning method described herein has the advantage of being simpler to implement that the hMetis methodology as it involves merely cutting wires ranked highest based on the wire weights, and determining such a highest ranking wire is relatively simple to perform.

Having thus described at least one illustrative embodiment, various alterations, modifications and improvements will readily occur to those skilled in the art.

For example, while the case of a 3D circuit design having two tiers has been described, it will be apparent to those skilled in the art how this method could be extended more generally to 3D circuits having N tiers, where N is an integer equal to 2 or more. For example, in one embodiment the algorithm described above in relation to FIG. 2 is applied to a first tier using a relatively high wire length threshold in order to transfer around 1/N of the 2D circuit design to a second adjacent tier, for example based on the criterion of area or power consumption of each circuit element. The algorithm is then for example applied again to the first tier using a lower wire length threshold in order to transfer around a further 1/N of the initial 2D circuit design to a third adjacent tier, again based on the criterion of area or power consumption. This process is for example repeated until around 1/N of the circuit design remains in the first tier. Furthermore, each time the algorithm is applied to two tiers, the wire length threshold is for example adjusted based on the distance separating the two tiers. Indeed, this distance will determine the length of the 3D vias, and thus their technology parameters, such as their parasitics.

Furthermore, while a process has been described in which selected interconnecting wires are cut, and then certain wires are restored if they have a length below a further length threshold $W_{TH2}$, alternative algorithms would be possible. For example, it would be possible to group together the circuit elements interconnected by wires shorter than the further length threshold $W_{TH2}$, and treat each group of circuit elements as a single circuit element when applying the partitioning process described herein. However, an advantage of allowing short interconnections to be cut and then restored is that, by this process, both of the circuit elements connected by the short interconnection may be moved to another tier, rather than remaining in the initial tier, leading to a more balanced partitioning.

Furthermore, while embodiments have been described based on MOS transistor technology, it will be apparent to those skilled in the art that the techniques described herein could be applied to other technologies.

The invention claimed is:

1. A 3D circuit design method implemented by a processing device, the method comprising:
   partitioning a 2D circuit representation into two or more tiers of a 3D circuit representation, wherein the 2D circuit representation defines a plurality of circuit elements and a plurality of interconnecting wires, each interconnecting wire representing an electrical connection between two or more circuit elements, wherein each interconnecting wire is weighted based on at least one of: its length; its propagation delay; and its priority level based on the extent to which it represents a critical transmission path, the 2D circuit representation initially forming a first tier of the 3D circuit representation, the partitioning comprising the steps of:
   a) selecting a first wire, interconnecting at least first and second circuit elements in the first tier, the first wire being selected as the highest ranking wire among the interconnecting wires based on its weight;
   b) moving one of the first and second circuit elements connected by the selected wire to a further tier of the 3D circuit representation and replacing the interconnecting wire with a connecting via between the first and further tiers; and
   c) repeating steps a) and b) for one or more further highest ranked interconnecting wires of the first tier;
   performing place and route on the 3D circuit representation to generate a 3D circuit design; and
   fabricating an integrated circuit based on the 3D circuit design.

2. The method of claim 1, wherein the first wire has a weight greater than a first threshold.

3. The method of claim 2, wherein steps a) and b) are repeated until one or more of the following conditions have been met:
   there are no more interconnecting wires in the first tier having a weight greater than the first threshold;
   the connecting via count has reached or has exceeded a limit;
   a certain area ratio between the first tier and one or more further tier has been achieved; and
   a certain power ratio between the first tier and one or more further tier has been achieved.

4. The method of claim 1, wherein selecting a first wire comprises ranking the interconnecting wires based on their weights.

5. The method of claim 1, wherein the interconnecting wires are weighted based on their lengths and the wire lengths are estimated using a half-perimeter-wire-length model.

6. The method of claim 1, further comprising:
   d) identifying in the 3D circuit representation an interconnecting wire having a weight less than a second threshold and that has been replaced by a connecting via;
   e) restoring the identified interconnecting wire by replacing the connecting via by an interconnecting wire between circuit elements in a same tier; and
   f) repeating steps d) and e) until there are no connecting vias replacing interconnecting wires that have a weight of less than the second threshold.

7. The method of claim 1, wherein each circuit element in the 2D circuit representation comprises an indication of at least one of: its surface area; and its power consumption; the method further comprising:
   verifying whether one of: an area ratio limit; a power consumption ratio limit; and a connecting via count limit, has been exceeded in the 3D circuit representation, and if so restoring one or more interconnecting wires by replacing the connecting via by an interconnecting wire between circuit elements in a same tier.

8. The method of claim 1, wherein the 2D circuit representation is a 2D netlist, and partitioning the 2D circuit representation comprises converting the 2D netlist into a hypergraph having vertices corresponding to the circuit elements of the 2D circuit representation, and edges corresponding to the interconnecting wires of the 2D circuit representation.

9. The method of claim 1, wherein the circuit elements are standard cells selected from a standard cell library.

10. The method of claim 1, wherein the circuit elements are semiconductor devices, at least one of the circuit elements being a transistor.

11. A non-transitory storage device storing a computer program that, when executed by a processing device, causes the method of claim 1 to be implemented.

12. A computing device comprising:
    one or more memories storing instructions and a 2D circuit representation; and
    a processing device adapted to:
    generate, under control of said instructions, a 3D circuit representation by:
    partitioning the 2D circuit representation into two or more tiers of the 3D circuit representation, wherein the 2D circuit representation defines a plurality of circuit elements and a plurality of interconnecting wires, each interconnecting wire representing an electrical connection between two or more circuit elements, wherein each interconnecting wire is weighted based on at least one of: its length; its propagation delay; and its priority level based on the extent to which it represents a critical transmission path, the 2D circuit representation initially forming a first tier of the 3D circuit representation, the partitioning comprising the steps of:
    a) selecting a first wire, interconnecting at least first and second circuit elements in the first tier, the first wire being the highest ranking wire among the interconnecting wires based on its weight;
    b) moving one of the first and second circuit elements connected by the selected wire to a further tier of the 3D circuit representation and replacing the interconnecting wire with a connecting via between the first and further tiers; and
    c) repeating steps a) and b) for one or more further interconnecting wires of the first tier; and
    perform place and route on the 3D circuit representation to generate a 3D circuit design; and
    causing to be fabricated an integrated circuit based on the 3D circuit design.

13. The computing device of claim 12, wherein the first wire further interconnects one or more further circuit elements to the first and second circuit elements, and step b) further comprises moving one or more of the further circuit elements to the further tier.

* * * * *